United States Patent [19]
Hasegawa

[11] Patent Number: 6,100,197
[45] Date of Patent: Aug. 8, 2000

[54] METHOD OF FABRICATING A SEMICONDUCTOR DEVICE

[75] Inventor: Mieko Hasegawa, Tokyo, Japan

[73] Assignee: NEC Corporation, Tokyo, Japan

[21] Appl. No.: 09/415,922

[22] Filed: Oct. 12, 1999

[30]     Foreign Application Priority Data

Oct. 13, 1998  [JP]  Japan .................................. 10-290539

[51] Int. Cl.⁷ .................................................. H01L 21/44
[52] U.S. Cl. .......................... 438/687; 438/629; 438/631; 438/637; 438/643; 438/645; 438/672; 438/692; 438/693
[58] Field of Search ..................... 438/687, 629, 438/631, 637, 643, 645, 672, 692, 693

[56]              References Cited

U.S. PATENT DOCUMENTS

| 5,637,185 | 6/1997  | Murarka et al. ............................. 438/5 |
| 5,928,962 | 7/1999  | Farkas et al. ............................ 438/692 |
| 5,961,373 | 10/1999 | Lai et al. .................................. 451/41 |

FOREIGN PATENT DOCUMENTS

| 7-86216 | 3/1995 | Japan . |
| 7-193034 | 7/1995 | Japan . |
| 9-22907 | 1/1997 | Japan . |
| 9-213699 | 8/1997 | Japan . |
| 2728025 | 12/1997 | Japan . |

*Primary Examiner*—John F. Niebling
*Assistant Examiner*—Lynne Gurley
*Attorney, Agent, or Firm*—McGinn & Gibb, P.C.

[57]              ABSTRACT

There is provided a method of fabricating a semiconductor device, including the steps of (a) forming recesses at a surface of an underlying insulating film, (b) covering inner surfaces of the recesses and a surface of the underlying insulating film with a barrier film, (c) depositing a copper film over the barrier film to thereby fill the recesses with copper, and (d) applying chemical mechanical polishing (CMP) to the copper film through the use of inorganic slurry on the condition that a polishing load is equal to or smaller than 140 g/cm² and a linear velocity at a center of a wafer is equal to or smaller than 0.1 m/s. Though a copper film tends to be peeled off after CMP has been applied thereto in a conventional method, the method ensures that a copper film is no longer peeled off even after CMP has been applied thereto.

16 Claims, 5 Drawing Sheets

METHOD OF FABRICATING A SEMICONDUCTOR DEVICE

BACKGROUND OF THE INVENTION

1. Field of the Invention

The invention relates to a method of fabricating a semiconductor device such as LSI, and more particularly to chemical mechanical polishing (CMP) in such a method.

2. Description of the Related Art

As LSI has been recently fabricated in higher integration, there is an increasing need for a technique for fabricating a device in a smaller size. In particular, a minimum size for a wiring pattern is presently in an order of submicron, and hence, a need for fabricating a device in a smaller size has been increased.

One of techniques having been developed for meeting such a need is chemical mechanical polishing (hereinafter, referred to simply as "CMP"). CMP is presently indispensable for planarization of an interlayer insulating film, formation of a plug in a via-hole, and formation of a buried metal wiring layer, for instance.

FIGS. 1A to 1E illustrates steps of forming a buried metal wiring layer by CMP.

First, as illustrated in FIG. 1A, an insulating film 41 is formed on a semiconductor substrate 40. Then, the insulating film 41 is planarized.

Then, as illustrated in FIG. 1B, there are formed a plurality of recesses 42 at a surface of the insulating film 41 by photolithography and etching.

Then, as illustrated in FIG. 1C, a barrier metal film 43 is formed all over the insulating film 41.

Then, as illustrated in FIG. 1D, a metal film 44 for making a wiring layer is deposited on the barrier metal film 43.

Then, the metal film 44 and the barrier metal film 43 are polished by CMP so that the metal film 44 remains only in the recesses 42, as illustrated in FIG. 1E.

Thus, there is completed a wiring layer composed of the metal film 44.

FIG. 2A illustrates a step of forming a wiring layer composed of copper.

First, a silicon dioxide film 51 as an underlying oxide film is formed with recesses 52. Then, a titanium nitride (TiN) film 53 as a barrier film is formed all over the silicon dioxide film 51.

Then, a copper film 54 is formed on the TiN barrier film 53 by plating so that the recesses 52 are filled with the copper film 54.

Then, the copper film 54 is polished by CMP in which there is used slurry consisting of alumina particles and aqueous solution of hydrogen peroxide as an oxidizer.

The polishing conditions for polishing the copper film 54 are generally as follows.

Polishing load: 490 g/cm$^2$

Linear velocity at a center of a wafer: 0.2 m/s

However, if the copper film 54 is polished by CMP in the above-mentioned conditions, a mechanical force acts on the copper film 54 because the polishing load and the linear velocity are both relatively high, resulting in that the copper film 54 might be peeled off from the barrier film 53 after CMP has been carried out, as illustrated in FIG. 2B.

A lot of suggestion have been made about CMP, for instance, in Japanese Unexamined Patent Publications Nos. 7-86216, 7-193034, 9-22907, 9-213699, and 8-288389 (Japanese Patent No. 2728025).

Japanese Unexamined Patent Publication No. 7-86216 has suggested a method in which particles composed of organic polymer are used as polishing particles, and residual slurry is burnt for removal after CMP has been carried out. In this method, since the polishing particles are spherical ones, a film to be polished is not damaged. The polishing conditions in this method are as follows.

Revolution per minute (rpm): 100 (100 rpm is equivalent to a linear velocity of 0.5 m/s)

Load: 300 gf/cm$^2$

Japanese Unexamined Patent Publication No. 9-213699 has suggested a method of forming a multi-layered wiring structure, including the steps of filling recesses with aluminum by selective CVD, and polishing the aluminum by CMP. The polishing conditions are as follows.

Revolution per minute of a table: 30 to 60 rpm

Load: 2 to 8 psi 30 to 60 rpm is equivalent to a linear velocity of 0.15 to 0.3 m/s, and 2 to 8 psi is equivalent to 140 to 560 gf/cm$^2$.

The above-mentioned methods cannot avoid that a mechanical force acts on a copper film, and hence, a copper film is peeled off after CMP has been carried out, similarly to FIG. 2B, because a polishing load and a linear velocity are both relatively high in the polishing conditions in the above-mentioned methods.

SUMMARY OF THE INVENTION

In view of the above-mentioned problem, it is an object of the present invention to provide a method of fabricating a semiconductor device, which method is capable of avoiding a copper film from being peeled off after CMP has been carried out.

In one aspect, there is provided a method of fabricating a semiconductor device, including the step of applying chemical mechanical polishing to a copper wiring layer formed at a surface of a wafer, the copper wiring layer being polished on the condition that a linear velocity at a center of the wafer is equal to or smaller than 0.1 m/s.

There is further provided a method of fabricating a semiconductor device, including the steps of (a) forming recesses at a surface of an underlying insulating film, (b) covering inner surfaces of the recesses and a surface of the underlying insulating film with a barrier film, (c) depositing a copper film over the barrier film to thereby fill the recesses with copper, and (d) applying chemical mechanical polishing to the copper film through the use of inorganic slurry on the condition that a polishing load is equal to or smaller than 140 g/cm$^2$ and a linear velocity at a center of a wafer is equal to or smaller than 0.1 m/s.

There is still further provided a method of fabricating a semiconductor device, including the steps of (a) forming recesses at a surface of an underlying insulating film, (b) depositing a copper film over the underlying insulating film to thereby fill the recesses with copper, and (c) applying chemical mechanical polishing to the copper film through the use of inorganic slurry on the condition that a polishing load is equal to or smaller than 140 g/cm$^2$ and a linear velocity at a center of a wafer is equal to or smaller than 0.1 m/s.

It is preferable that the method further includes the step of (d) applying plasma treatment to the underlying insulating film. The step (d) is to be carried out subsequently to the step (a), but prior to the step (b).

It is preferable that a back load is equal to or smaller than 80% of the polishing load.

It is preferable that the step (b) further includes the steps of (b1) forming a seed layer composed of copper and having a first thickness, and (b2) forming a copper layer over the seed layer, the copper layer having a second thickness greater than a first thickness.

It is preferable that the seed layer is formed by plating, chemical vapor deposition (CVD) or sputtering.

It is preferable that the inorganic slurry is composed of a mixture of suspension containing alumina particles or silica particles, and aqueous solution of hydrogen peroxide.

It is preferable that a mixture ratio of the suspension to the aqueous solution is in the range of 3:1 to 1:3.

The advantages obtained by the aforementioned present invention will be described hereinbelow.

In accordance with the present invention, a linear velocity at a center of a wafer and a polishing load are controlled so that they are in the abovementioned range. As a result, a mechanical force caused by CMP is prevented from acting on a copper film, and hence, it is possible to prevent a copper film having weak adhesion force from being peeled off.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

FIGS. 3A to 3E illustrate respective steps of a method of fabricating a semiconductor device, in accordance with the first embodiment.

Figure 1A:
FIGS. 1A to 1E are cross-sectional views of a semiconductor device, illustrating respective steps of a conventional method of fabricating a semiconductor device.
Figure 1B:
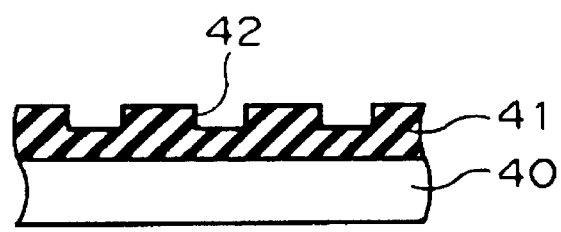
Figure 1C:
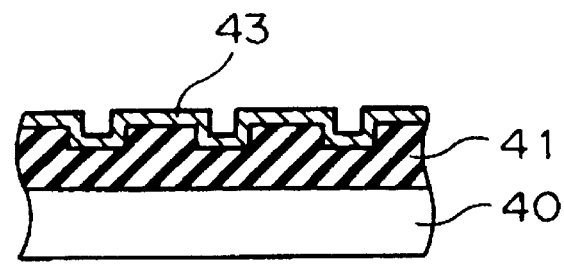
Figure 1D:
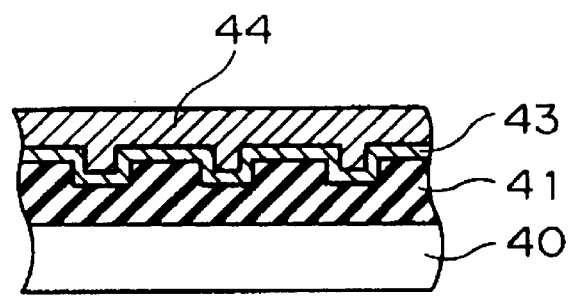
Figure 1E:
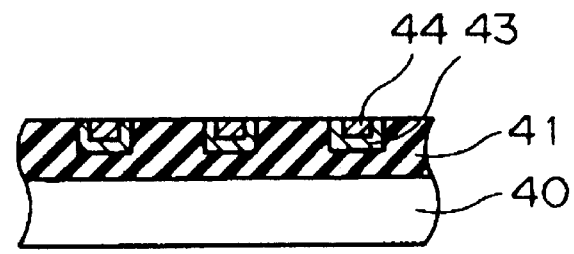
Figure 2A:
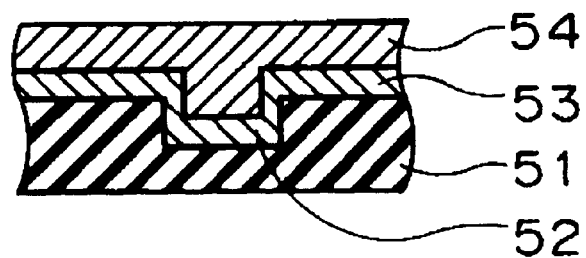
FIGS. 2A and 2B are cross-sectional views of a semiconductor device, illustrating respective steps of another conventional method of fabricating a semiconductor device.
Figure 2B:
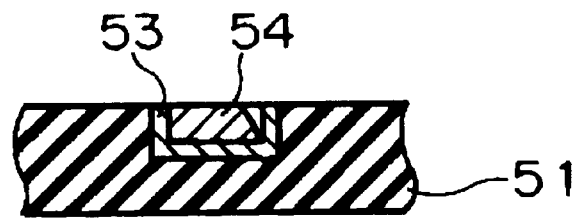
Figure 3A:
FIGS. 3A to 3E are cross-sectional views of a semiconductor device, illustrating respective steps of a method of fabricating a semiconductor device, in accordance with the first embodiment of the present invention.

First, as illustrated in FIG. 3A, a silicon dioxide film 11 as an insulating film is formed on a semiconductor substrate 10. Then, the silicon dioxide film 11 is planarized.

Figure 3B:
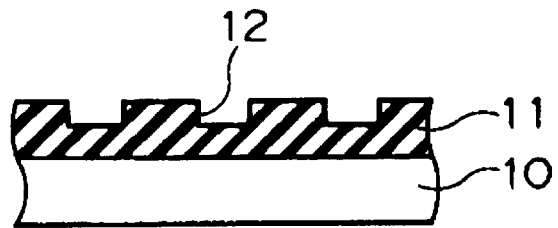

Then, as illustrated in FIG. 3B, there are formed a plurality of recesses 12 at a surface of the silicon dioxide film 11 by photolithography and etching. The recesses 12 have a depth of 5000 angstroms.

Figure 3C:
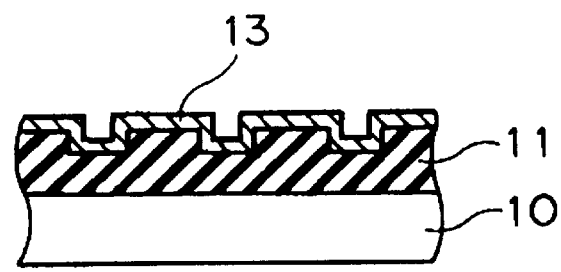

Then, as illustrated in FIG. 3C, a titanium nitride (TiN) film 13 as a barrier metal film is formed all over the silicon dioxide film 11. The titanium nitride film 13 has a thickness of 500 angstroms.

Figure 3D:
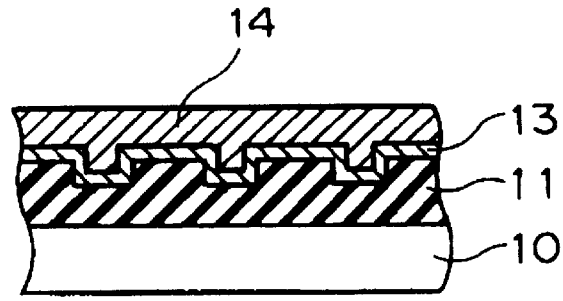

Then, as illustrated in FIG. 3D, a copper film 14 is deposited on the barrier metal film 13 so that the recesses 12 are filled with the copper film 14.

The copper film 14 is deposited by steps of forming a copper seed layer by sputtering by a thickness of 1000 angstroms, and then, immediately forming a copper layer by plating by a thickness of 8000 angstroms.

Figure 3E:
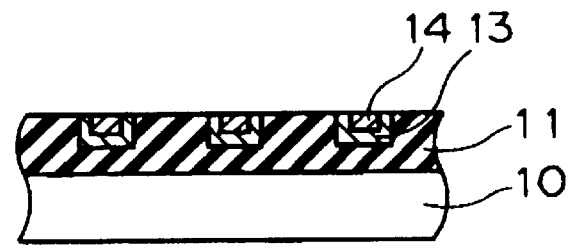

Then, the copper film 14 and the titanium nitride film 13 are polished by CMP so that the copper film 14 remains only in the recesses 12, as illustrated in FIG. 3E. Thus, there is formed a damacine wiring layer.

In the step of polishing the copper film 14 and the titanium nitride film 13 by CMP, there is used slurry consisting of suspension containing alumina particles therein, and aqueous solution of hydrogen peroxide as an oxidizer. A mixture ratio between the suspension and the aqueous solution of hydrogen peroxide is 1:1.

The polishing conditions are as follows.

Polishing load: 140 g/cm$^2$

Back load: 112 g/cm$^2$

Linear velocity at a center of a wafer: 0.1 m/s

Figure 4:
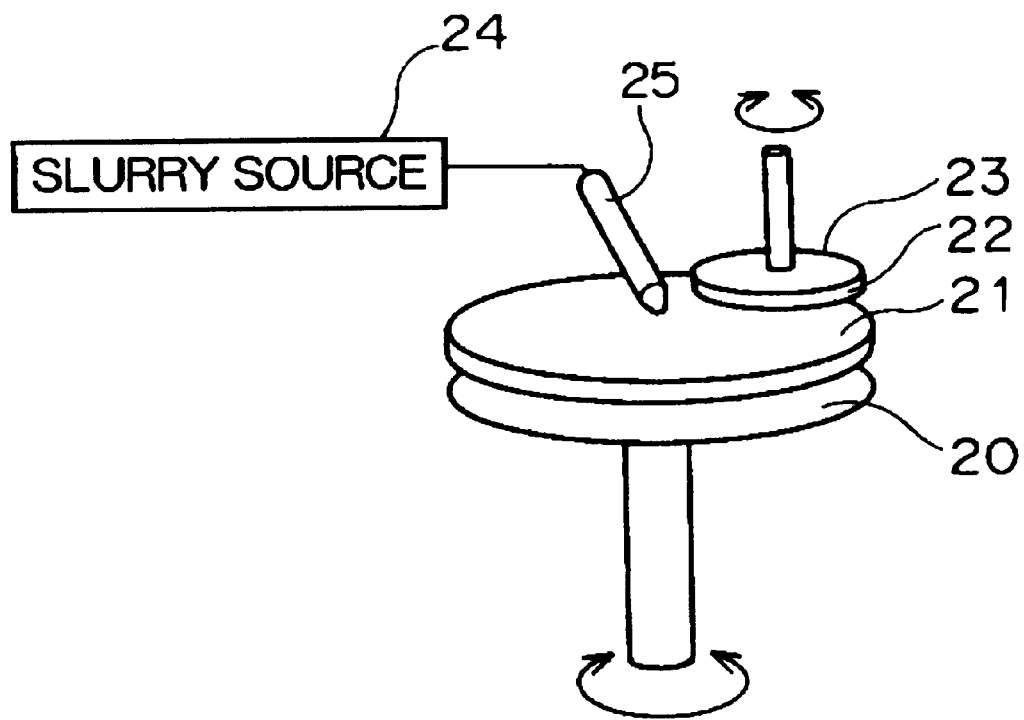
FIG. 4 is a perspective view illustrating an apparatus to be used for carrying out CMP in the first embodiment.

FIG. 4 illustrates an apparatus used for carrying out CMP in the first embodiment.

The illustrated apparatus is comprised of a table 20 driven for rotation by a motor (not illustrated), a polishing pad 21 fixed on the table 20 and composed of urethane foam, a rotatable carrier 23 for fixating a wafer 22 onto the polishing pad 21, a slurry source 24 containing the above-mentioned slurry, and a slurry injection pipe 25 which supplies the slurry between the polishing pad 21 and the wafer 22.

The wafer 22 is formed at a surface thereof with the copper film 14 illustrated in FIG. 3D. The wafer 22 is supported by the carrier 23 in such a manner that the copper film 14 is in contact with the polishing pad 21. The table 20 and the carrier 23 rotate independently with each other, and thus, the polishing pad 21 and the wafer 22 rotate independently with each other, being kept in contact with each other. Thus, CMP is applied to the copper film 14.

In accordance with the first embodiment, it is possible to suppress a mechanical force generated due to CMP and acting on the copper film 14, and as a result it is possible to solve the problems that the copper film 14 having weak adhesion force is peeled off from the barrier metal film 13 and that the copper film 14 is scratched.

Though a titanium nitride (TiN) film is used as the barrier metal film 13 in the first embodiment, it should be noted that there may be used a TiW film, a Ta film or a TaN film in place of the titanium nitride film.

In addition, the barrier metal film 13 is designed to have a thickness of 500 angstroms in the first embodiment, the barrier metal film may be designed to have any thickness, if it is equal to or smaller than 1000 angstroms.

When the copper film 14 is formed, the seed layer is formed by sputtering and the buried copper layer is formed by plating in the first embodiment. However, the seed layer and the buried copper layer may be formed by any one of plating, CVD and sputtering.

In the first embodiment, a mixture ratio between the suspension and the aqueous solution of hydrogen peroxide is designed to be equal to 1:1. However, it should be noted that the mixture ratio might be designed to be in the range of 3:1 to 1:3.

In addition, there may be selected silica particles in place of alumina particles.

Though the polishing load is set to be 140 g /cm$^2$ in the first embodiment, it should be noted that the polishing load may be designed to be any load, if it is equal to or smaller than 140 g/cm$^2$.

The back load is set to be 112 g/cm$^2$ in the first embodiment. However, the back load may be set to be any load, if it is equal to or smaller than 80% of the polishing load.

Though the linear velocity at a center of a wafer is set to be 0.1 m/s in the first embodiment, it should be noted that the linear velocity may be designed to be any velocity, if it is equal to or smaller than 0.1 m/s.

FIGS. 5A to 5D illustrate respective steps of a method of fabricating a semiconductor device, in accordance with the second embodiment.

Figure 5A:
FIGS. 5A to 5D are cross-sectional views of a semiconductor device, illustrating respective steps of a method of fabricating a semiconductor device, in accordance with the second embodiment of the present invention.

First, as illustrated in FIG. 5A, a silicon dioxide film 31 as an insulating film is formed on a semiconductor substrate 30. Then, the silicon dioxide film 31 is planarized.

Figure 5B:
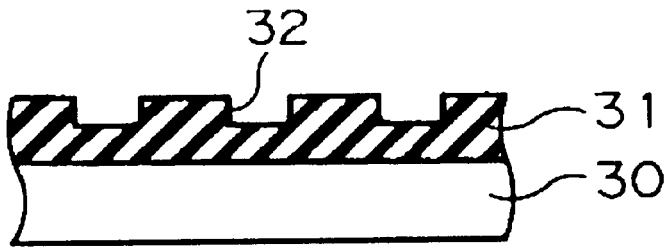

Then, as illustrated in FIG. 5B, there are formed a plurality of recesses 32 at a surface of the silicon dioxide film 31 by photolithography and etching. The recesses 32 have a depth of 5000 angstroms.

Then, plasma treatment is applied to the silicon dioxide film 31.

Figure 5C:
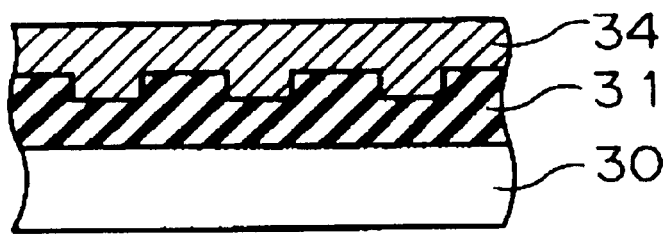

Then, as illustrated in FIG. 5C, a copper film 34 is deposited on the silicon dioxide film 31 so that the recesses 32 are filled with the copper film 34.

The copper film 34 is deposited by steps of forming a copper seed layer by sputtering by a thickness of 1000 angstroms, and then, immediately forming a copper layer by plating by a thickness of 8000 angstroms.

Figure 5D:
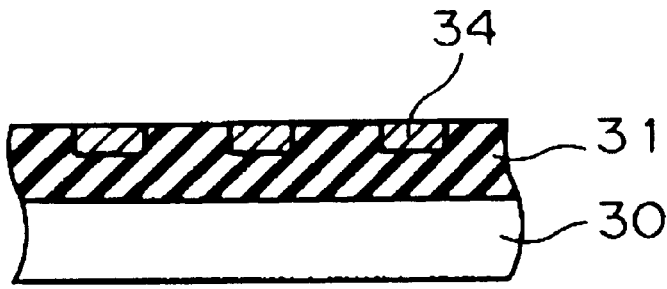

Then, the copper film 34 is polished by CMP so that the copper film 34 remains only in the recesses 32, as illustrated in FIG. 5D. Thus, there is formed a damacine wiring layer.

In the step of polishing the copper film 34 by CMP, there is used slurry consisting of suspension containing alumina particles therein, and aqueous solution of hydrogen peroxide as an oxidizer. A mixture ratio between the suspension and the aqueous solution of hydrogen peroxide is 1:1.

The polishing conditions are as follows.

Polishing load: 140 g/cm$^2$

Back load: 112 g/cm$^2$

Linear velocity at a center of a wafer: 0.1 m/s

CMP is carried out through the use of the apparatus illustrated in FIG. 4, similarly to the first embodiment.

In accordance with the second embodiment, it is possible to suppress a mechanical force generated due to CMP and acting on the copper film 34, and as a result, it is possible to solve the problems that the copper film 34 having weak adhesion force is peeled off from the silicon dioxide film 31 and that the copper film 34 is scratched.

In addition, it is not necessary in the second embodiment to form the barrier metal film 13 unlike the first embodiment, the number of fabrication steps can be reduced.

Similarly to the first embodiment, the copper film 34 may be formed by any one of plating, CVD and sputtering.

Similarly to the first embodiment, the mixture ratio between the suspension and the aqueous solution of hydrogen peroxide may be designed to be in the range of 3:1 to 1:3.

In addition, there may be selected silica particles in place of alumina particles.

Though the polishing load is set to be 140 g/cm$^2$, it should be noted that the polishing load may be designed to be any load, if it is equal to or smaller than 140 g/cm$^2$.

The back load is set to be 112 g/cm$^2$ in the second embodiment. However, the back load may be set to be any load, if it is equal to or smaller than 80% of the polishing load.

Though the linear velocity at a center of a wafer is set to be 0.1 m/s, it should be noted that the linear velocity may be designed to be any velocity, if it is equal to or smaller than 0.1 m/s.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 10-290539 filed on Oct. 13, 1998 including specification, claims, drawings and summary is incorporated herein by reference in its entirety.

What is claimed is:

1. A method of fabricating a semiconductor device, comprising the step of applying chemical mechanical polishing to a copper wiring layer formed at a surface of a wafer, said copper wiring layer being polished on the condition that a linear velocity at a center of said wafer is equal to or smaller than 0.1 m/s.

2. A method of fabricating a semiconductor device, comprising the steps of:
   (a) forming recesses at a surface of an underlying insulating film;
   (b) covering inner surfaces of said recesses and a surface of said underlying insulating film with a barrier film;
   (c) depositing a copper film over said barrier film to thereby fill said recesses with copper; and
   (d) applying chemical mechanical polishing to said copper film through the use of inorganic slurry on the condition that a polishing load is equal to or smaller than 140 g/cm$^2$ and a linear velocity at a center of a wafer is equal to or smaller than 0.1 m/s.

3. The method as set forth in claim 2, wherein a back load is equal to or smaller than 80% of said polishing load.

4. The method as set forth in claim 2, wherein said step (c) further includes the steps of:
   (c1) forming a seed layer composed of copper and having a first thickness; and
   (c2) forming a copper layer over said seed layer, said copper layer having a second thickness greater than a first thickness.

5. The method as set forth in claim 4, wherein said seed layer is formed by plating, chemical vapor deposition (CVD) or sputtering.

6. The method as set forth in claim 2, wherein said barrier film is composed of one of TiN, TiW, Ta and TaN.

7. The method as set forth in claim 6, wherein said barrier film has a thickness equal to or smaller than 1000 angstroms.

8. The method as set forth in claim 2, wherein said inorganic slurry is composed of a mixture of suspension containing alumina particles or silica particles, and aqueous solution of hydrogen peroxide.

9. The method as set forth in claim 8, wherein a mixture ratio of said suspension to said aqueous solution is in the range of 3:1 to 1:3.

10. A method of fabricating a semiconductor device, comprising the steps of:
    (a) forming recesses at a surface of an underlying insulating film;
    (b) depositing a copper film over said underlying insulating film to thereby fill said recesses with copper; and
    (c) applying chemical mechanical polishing to said copper film through the use of inorganic slurry on the condition that a polishing load is equal to or smaller than 140 g/cm$^2$ and a linear velocity at a center of a wafer is equal to or smaller than 0.1 m/s.

11. The method as set forth in claim 10, further comprising the step of (d) applying plasma treatment to said underlying insulating film, said step (d) being to be carried out subsequently to said step (a), but prior to said step (b).

12. The method as set forth in claim 10, wherein a back load is equal to or smaller than 80% of said polishing load.

13. The method as set forth in claim 10, wherein said step (b) further includes the steps of:
   (b1) forming a seed layer composed of copper and having a first thickness; and
   (b2) forming a copper layer over said seed layer, said copper layer having a second thickness greater than a first thickness.

14. The method as set forth in claim 13, wherein said seed layer is formed by plating, chemical vapor deposition (CVD) or sputtering.

15. The method as set forth in claim 10, wherein said inorganic slurry is composed of a mixture of suspension containing alumina particles or silica particles, and aqueous solution of hydrogen peroxide.

16. The method as set forth in claim 15, wherein a mixture ratio of said suspension to said aqueous solution is in the range of 3:1 to 1:3.

* * * * *